(12) United States Patent
Yap et al.

(10) Patent No.: US 12,322,692 B2
(45) Date of Patent: Jun. 3, 2025

(54) SOLDER MASK FOR THERMAL PAD OF A PRINTED CIRCUIT BOARD TO PROVIDE RELIABLE SOLDER CONTACT TO AN INTEGRATED CIRCUIT

(71) Applicant: STMICROELECTRONICS PTE LTD, Singapore (SG)

(72) Inventors: Daniel Yap, Singapore (SG); Hung Meng Loh, Bukit Panjang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 556 days.

(21) Appl. No.: 17/572,247

(22) Filed: Jan. 10, 2022

(65) Prior Publication Data
US 2022/0130750 A1 Apr. 28, 2022

Related U.S. Application Data

(62) Division of application No. 16/550,775, filed on Aug. 26, 2019, now Pat. No. 11,244,892.

(Continued)

(51) Int. Cl.
*H01L 23/48* (2006.01)
*H01L 21/48* (2006.01)
(Continued)

(52) U.S. Cl.
CPC .... *H01L 23/49861* (2013.01); *H01L 21/4867* (2013.01); *H01L 23/3114* (2013.01);
(Continued)

(58) Field of Classification Search
CPC ........... H01L 23/49861; H01L 23/3114; H01L 21/4867; H01L 23/4952; H01L 23/49568;
(Continued)

(56) References Cited

U.S. PATENT DOCUMENTS

| 2006/0237224 A1* | 10/2006 | Fujii | H05K 3/341 |
| | | | 174/256 |
| 2007/0148816 A1* | 6/2007 | Davis, Jr. | H05K 3/341 |
| | | | 438/106 |

(Continued)

FOREIGN PATENT DOCUMENTS

| CN | 201700085 U | 1/2011 |
| CN | 202285232 U | 6/2012 |

(Continued)

OTHER PUBLICATIONS

Huang, Zhiwei "Analog Circuit Design Based on TI Devices," Beijing University of Aeronautics and Astronautics Press, Jul. 31, 2014, Beijing, China. (with English Machine Translation) (8 pages).

(Continued)

*Primary Examiner* — Ismail A Muse
(74) *Attorney, Agent, or Firm* — Seed IP Law Group LLP (57) ABSTRACT

A method of forming a solder connection includes forming a solder mask on a thermal pad of a printed circuit board. The solder mask leaves unmasked portions of the thermal pad and forming the solder mask includes forming a plurality of mask stripes extending from edges of each unmasked portion towards a center of the unmasked portion. The method includes depositing solder paste on the unmasked portions of the thermal pad and placing an exposed thermal pad of an integrated circuit package on the solder paste deposited on the thermal pad of the printed circuit board. The method includes forming a solder connection by heating the solder paste between the unmasked portions of the thermal pad on the printed circuit board and the exposed thermal pad of the integrated circuit package.

20 Claims, 11 Drawing Sheets

Related U.S. Application Data (60) Provisional application No. 62/725,059, filed on Aug. 30, 2018.

(51) Int. Cl.
*H01L 23/31* (2006.01)
*H01L 23/495* (2006.01)
*H01L 23/498* (2006.01)
*H01L 23/52* (2006.01)
*H01L 29/40* (2006.01)
*H05K 3/34* (2006.01)

(52) U.S. Cl.
CPC .... *H01L 23/49513* (2013.01); *H01L 23/4952* (2013.01); *H01L 23/49568* (2013.01); *H05K 3/3452* (2013.01)

(58) Field of Classification Search
CPC ..... H01L 23/49513; H01L 2224/32245; H01L 2224/48091; H01L 2924/181; H01L 2224/48247; H01L 2224/73265; H01L 23/49894; H01L 23/49555; H01L 23/3677; H05K 1/111; H05K 3/3463; H05K 2201/10689; H05K 2203/0465; H05K 3/3452
See application file for complete search history.

(56) References Cited

U.S. PATENT DOCUMENTS

| | | | | |
|---|---|---|---|---|
| 2010/0252938 | A1* | 10/2010 | Ozawa | H01L 25/0657 |
| | | | | 257/778 |
| 2014/0027162 | A1* | 1/2014 | Chan | H05K 1/092 |
| | | | | 174/257 |
| 2018/0233861 | A1* | 8/2018 | Golko | H01R 24/64 |

FOREIGN PATENT DOCUMENTS

| | | |
|---|---|---|
| CN | 103582302 A | 2/2014 |
| CN | 204761831 U | 11/2015 |
| CN | 205726645 U | 11/2016 |
| CN | 106604526 A | 4/2017 |
| JP | 2006303173 A | 11/2006 |
| JP | 2006315183 A | 11/2006 |
| JP | 2008311417 A | 12/2008 |
| JP | 2012099682 A | 5/2012 |
| JP | 2016162813 A | 9/2016 |

OTHER PUBLICATIONS

Wu, Yiping "Electronic Assembly Technology," Huazhong University of Science and Technology Press, Dec. 31, 2006, China. (with English Machine Translation) (8 pages).

\* cited by examiner

SOLDER MASK FOR THERMAL PAD OF A PRINTED CIRCUIT BOARD TO PROVIDE RELIABLE SOLDER CONTACT TO AN INTEGRATED CIRCUIT

BACKGROUND

Technical Field

The present disclosure relates generally to the interconnection of integrated circuits, and more specifically to solder mask patterns for improved interconnection of an integrated circuit to a thermal pad on a printed circuit board.

Description of the Related Art

Modern integrated circuits can include extremely large numbers of components, such as transistors. This number can be in the tens of millions, hundreds of millions, or even billions of transistors formed in complex integrated circuits such as microprocessors. The switching of these large numbers of transistors at high frequencies can result in power consumption that generates relatively large amounts of unwanted heat during operation of the integrated circuit. As will be will appreciated by those skilled in the art, this heat must be properly dissipated to maintain the integrated circuit within allowable temperature limits during operation. This may be done in a variety of different ways. One approach is to include an exposed thermal pad on a bottom surface of a package including the integrated circuit. Different types of packages may include such exposed thermal pads, such as a Quad Flat Package (QFP). This exposed thermal pad is made from a suitable thermally conductive material, and is then coupled to an external heat sink to provide for dissipation of the generated heat. The external heat sink may be a thermal pad on a printed circuit board (PCB), with the exposed thermal pad on the bottom surface of the package then being thermally coupled to the PCB thermal pad.

These thermal pads are typically formed from electrically conductive materials, which in general are also good thermal conductors. The interconnection of the thermal pads is then accomplished by soldering the two pads together. Solder paste is deposited on the PCB thermal pad and the package is then placed on the PCB to position the exposed thermal pad on the bottom of the package on the solder paste on PCB thermal pad. This temporarily attaches the two pads together through the solder paste. The solder paste is then reflowed, meaning the solder paste is subjected to heat to melt the solder in the solder paste and thereby form a solder joint or connection between the two thermal pads. Ideally, this reflow process provides a good connection between the two thermal pads since the thermal dissipation of heat generated by the integrated circuit depends on a solid connection to the PCB thermal pad so the latter can properly dissipate this generated heat.

For a variety of different reasons, such as air bubbles in the solder paste during the reflow process, a solid connection between the two thermal pads may not result after reflow. Thus, instead of a solid solder connection over the entire surface areas of the two thermal pads, an uneven or intermittent connection may be formed, with some areas of the two pads being solidly connected while others are not connected or are not solidly connected. These types of uneven or intermittent connections reduce the thermal dissipation of heat generated by the integrated circuit in the package, which may result in damage and reduced operable life of the integrated circuit.

There is a need for improving the connections between thermal pads to improve the thermal conduction and corresponding thermal dissipation provided by the pads.

BRIEF SUMMARY

In one embodiment of the present disclosure, a method of forming a solder connection includes forming a solder mask on a thermal pad of a printed circuit board. The solder mask leaves unmasked portions of the thermal pad and forming the solder mask includes forming a plurality of mask stripes extending from edges of each unmasked portion towards a center of the unmasked portion. The method includes depositing solder paste on the unmasked portions of the thermal pad and placing an exposed thermal pad of an integrated circuit package on the solder paste deposited on the thermal pad of the printed circuit board. The solder paste is heated to form a solder connection between the unmasked portions of the thermal pad on the printed circuit board and the exposed thermal pad of the integrated circuit package.

DETAILED DESCRIPTION

Figure 1:
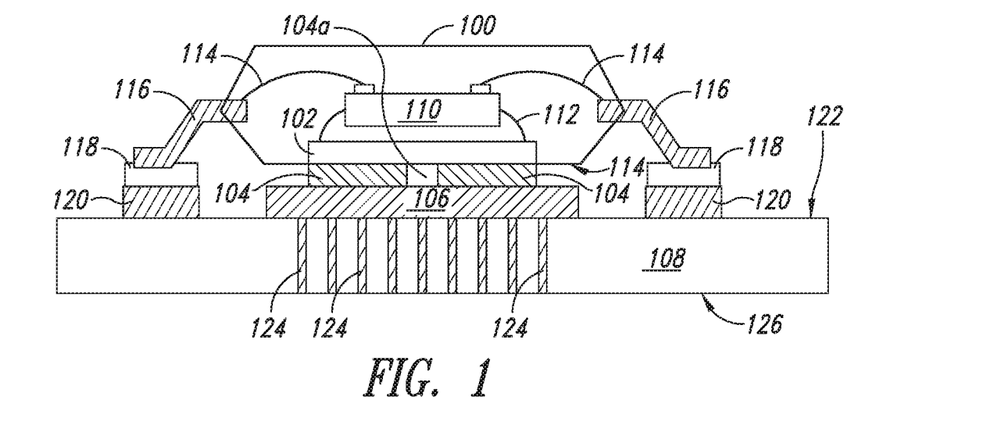
FIG. 1 is a cross-sectional view of a quad flat package including an exposed thermal pad attached though a solder connection to a thermal pad on a printed circuit board according to one embodiment of the present disclosure.

FIG. 1 is a cross-sectional view of a quad flat package (QFP) 100 including an exposed thermal pad 102 attached though a solder connection 104 to a thermal pad 106 of a printed circuit board (PCB) 108 according to one embodiment of the present disclosure. A solder mask (not shown in FIG. 1) is formed on the PCB thermal pad 106 and surrounding portion of the PCB prior to deposition of solder paste on this PCB thermal pad. This solder mask has a configuration that generates the solder connection 104 during reflow of the solder paste to form the solder connection 104 that provides an improved interconnection of the thermal pads 102 and 106, as will be described in more detail below.

In the present description, certain details are set forth in conjunction with the described embodiments to provide a sufficient understanding of the present disclosure. One skilled in the art will appreciate, however, that embodiments of the disclosure may be practiced without these particular details. Furthermore, one skilled in the art will appreciate that the present disclosure is not limited to the example embodiments described herein, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. The operation of well-known components and/or processes has not been shown or described in detail below to avoid unnecessarily obscuring the present disclosure. Finally, components that are common among the described embodiments are given the same reference numbers or descriptors in the present application even though the detailed operation of such components may vary among embodiments.

As seen in FIG. 1, the QFP 100 includes a die 110 containing the integrated circuitry for implementing specific functionality of the packaged device, such as digital signal processing circuitry were the QFP is a digital signal processor or general processing circuitry where the QFP is a microprocessor. The die 110 is physically attached to the exposed thermal pad 102 of the QFP 100 through an attachment material 112 such as an epoxy or other suitable material. The attachment material 112 is a thermally conductive material so that heat generated by the integrated circuitry in the die 110 during operation is transferred to the exposed thermal pad 102. Electrical contacts on the die 110 are electrically coupled through bonding wires 114 to gull-wing leads 116 extending from edges of the QFP 100. These leads 116 extend from all four edges four edges of the QFP 100, and this package is accordingly referred to as a "quad" type package.

The gull-wing leads 116 are coupled through solder connections 118 to conductive pads or contacts 120 on a first surface 122 of the PCB 108. These solder connections 118 would also typically be formed from solder paste deposited on the contacts 120 at the same time solder paste is deposited on the PCB thermal pad 106 as part of forming the solder connection 104. This solder paste on the contacts 120 and PCB thermal pad 106 is then reflowed to form the solder connections 104 and 118, as will be described in more detail below. The solder connection 104 includes a plurality of separate segments or portions separated by gaps 104*a* due to the solder mask formed on the PCB thermal pad 106, as will also be described in more detail below.

In the structure of FIG. 1, the PCB 108 further includes thermal vias 124 extending through the PCB 108 from the first surface 122 to a second surface 126 opposite the first surface. The thermal vias 124 are formed from a suitable thermally conductive material, such as metal, and are coupled to the PCB thermal pad 106 to further dissipate heat on the PCB thermal pad received from the die 110 through the material 112, exposed thermal pad 102 and solder connection 104. A heat dissipation structure (not shown) such as a metallic heat sink may also be attached to the second surface 126 of the PCB 108 and coupled to the thermal vias 124 to provide further dissipation of heat generated by the die 110 in the QFP 100. These thermal vias 124 are shown as being filled with the thermally conductive material in FIG. 1, but in other embodiments the vias may be hollow vias extending between the surfaces 122 and 126. Each hollow via 124 would in this embodiment be a through hole extending through the PCB 108 from surface 122 to 126, with the through hole being coated by a layer of the thermally conductive material. The thermal vias 124 may extend from the PCB thermal pad 106 through the PCB 108 to the surface 126 of the PCB where the vias are formed by laser or by mechanical drilling a hole through a top copper surface of the PCB prior to followed by electroless plating of a conductive material such as copper on the walls of the holes and a subsequent thick electroplating of copper to form the PCB thermal pad.

Figure 2:
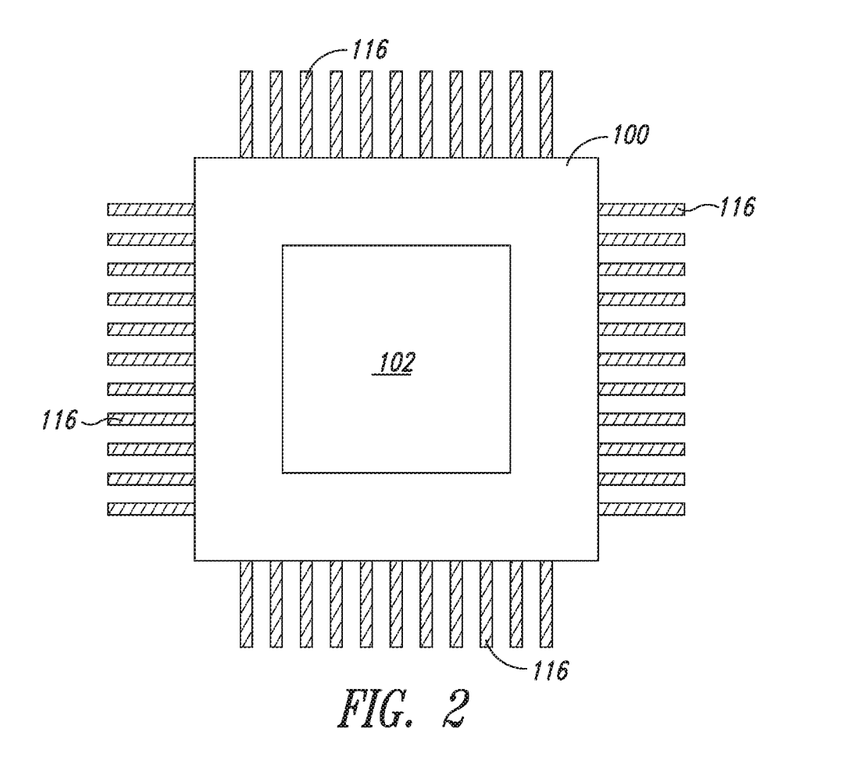
FIG. 2 is a bottom view of the quad flat package of FIG. 1 showing the exposed thermal pad on this bottom surface.

FIG. 2 is a bottom view of the QFP 100 of FIG. 1 showing the exposed thermal pad 102 on the bottom surface of this package. The package 100 is shown as being a QFP in the embodiments described in the present application, but may be any type of package having an exposed thermal pad, as will be appreciated by those skilled in the art.

Figure 3:
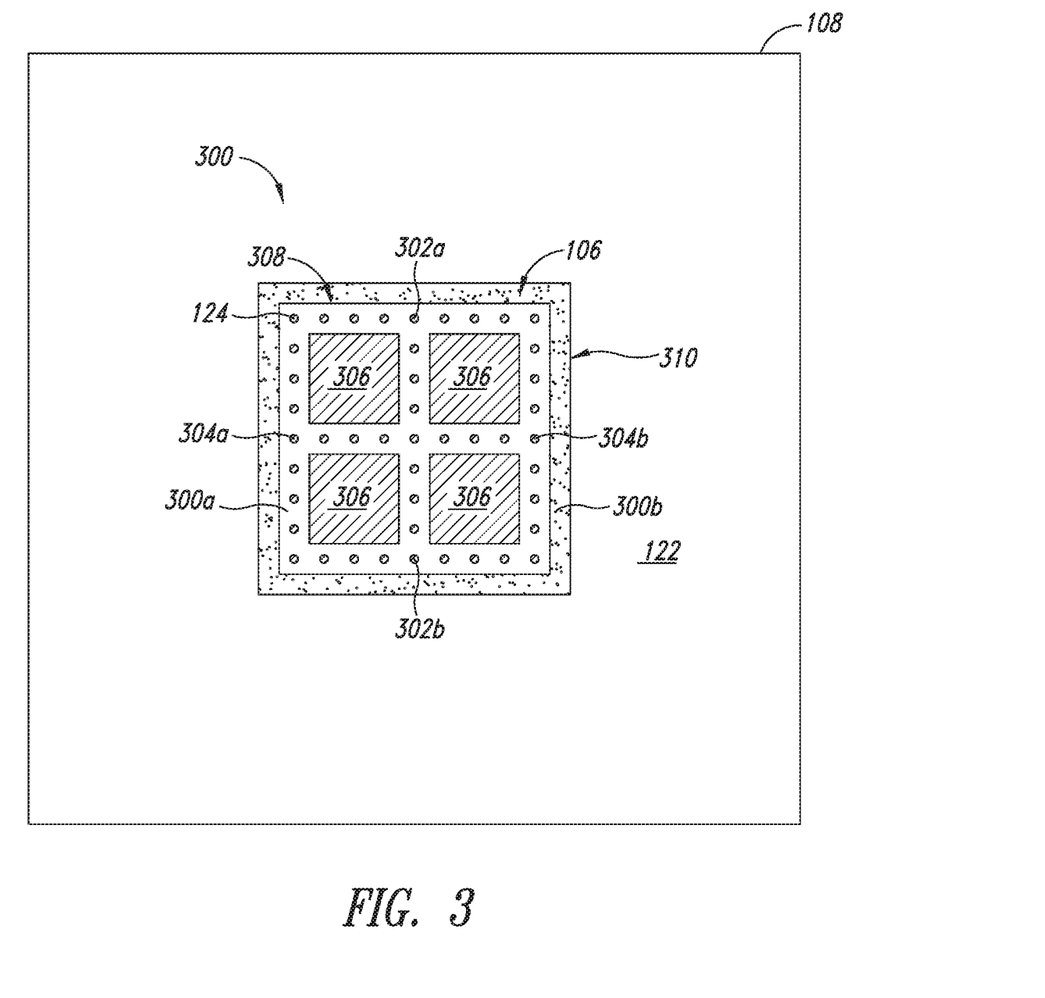
FIG. 3 is top view of the printed circuit board of FIG. 1 showing a solder mask formed on the thermal pad and upper surface of the printed circuit board prior to deposition of the solder paste on the thermal pad and placement of the quad flat package.

FIG. 3 is top view of the PCB 108 of FIG. 1 showing a solder mask 300 formed on the PCB thermal pad 106 and the PCB prior to deposition of the solder paste on the thermal pad and placement of the QFP 100 on this solder paste. The PCB thermal pad 106 is formed on the surface 122 of the PCB 108. The conductive pads or contacts 120 on the surface 122 of the PCB 108 in FIG. 1 are not illustrated in FIG. 3 to simplify this figure. The thermal vias 124 are coupled to the side of the PCB thermal pad 106 on the surface 122 of the PCB 108 and these thermal vias are illustrated as cross-hatched circles 302 in FIG. 3. The vias 124 are formed around the perimeter of the PCB thermal pad 106, which is square shaped in the example of FIG. 3. The thermal vias 124 also include a column of thermal vias extending from a top center thermal via 302*a* to a bottom center thermal via 302*b*, and a row of thermal vias extending from a left center thermal via 304*a* to a right center thermal via 304*b*. The solder mask 300 includes an inner solder mask 300*a* and an outer solder mask 300*b*, the inner solder mask 300*a* being formed in the center of the PCB thermal pad 106 and extending over the thermal vias 124. The outer solder mask 300*b* extends from outer edges 308 of the inner solder mask 300*a* on the surface 122 of the PCB 108 and thus surrounds the inner solder mask 300*a*. The inner solder mask 300*a* forms four unmasked portions 306 of the PCB thermal pad 106 surrounded by the inner solder mask. The outer solder mask 300b extends from the outer edges 308 of the inner solder mask 300a on the surface 122 of the PCB 108 and includes an outer edge 310.

Figure 4A:
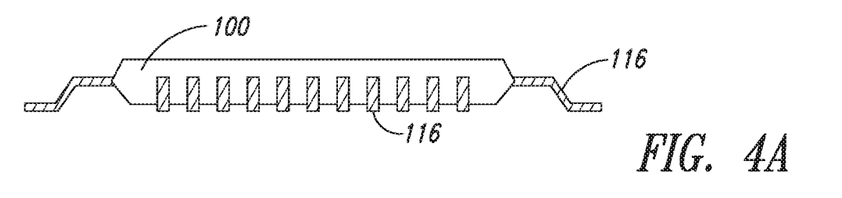
FIGS. 4A-4D illustrate formation of a solder mask and deposition of solder paste on the thermal pad on the printed circuit board of FIGS. 1 and 3.
Figure 4B:
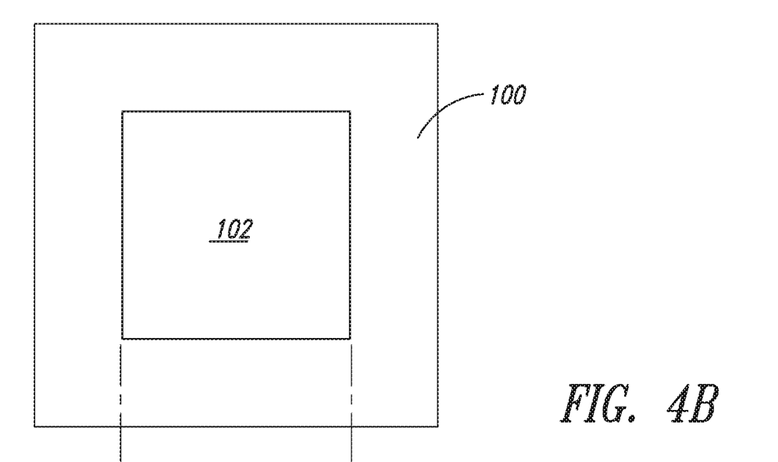
Figure 4C:
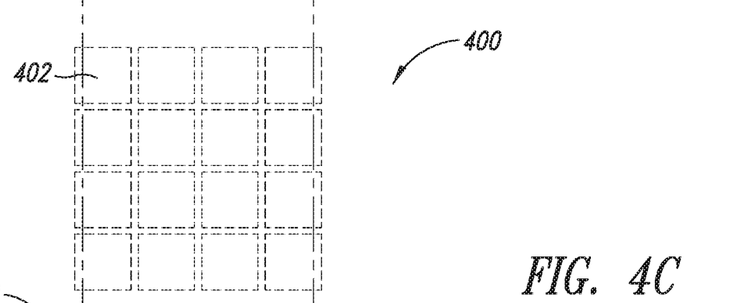
Figure 4D:
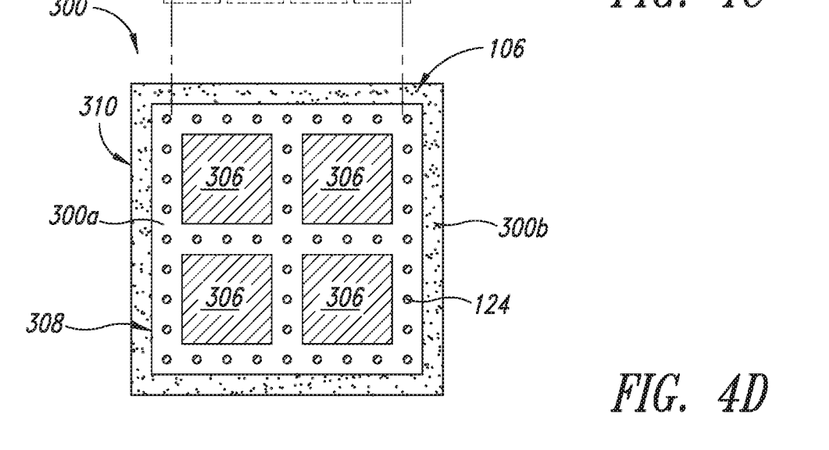

FIGS. 4A-4D illustrate formation of the solder masks 300a, 300b of FIG. 3 and deposition of solder paste on the PCB thermal pad 106 including the solder mask 300a. FIG. 4A is a side view of the QFP 100 of FIG. 1 and FIG. 4B is the bottom view of the QFP showing the exposed thermal pad 102. FIG. 4B does not illustrate the gull-wing leads 116 of the QFP 100 (see FIG. 2) to simplify this bottom view of the QFP showing the exposed thermal pad 102. FIG. 4C illustrates a stencil 400 including openings 402 through which solder paste is forced to deposit the solder paste on the PCB thermal pad 106 including the solder mask 300a, which is again illustrated in FIG. 4D. As will be described in more detail below, solder paste is forced through the openings 402 in the stencil 400 to thereby deposit the solder paste on the unmasked portions 306 of the PCB thermal pad 106 including the solder mask 300a. The solder mask 300a, along with solder mask 300b, are of course formed on the PCB thermal pad 106 and surface 122 of the PCB 108 (see FIG. 3) prior to deposition of the solder paste. One skilled in the art will understand suitable methods of forming and suitable materials for the solder mask 300a on the PCB thermal pad 106 and solder mask 300b on the surface 122 of the PCB 108, such as printing or silk screening the solder masks on the PCB thermal pad and PCB.

After deposition of the solder paste (not shown) on the exposed portions 306 of the PCB thermal pad 106, the exposed thermal pad 102 of the QFP 100 is then placed on the PCB thermal pad 106 and the solder paste reflowed to thereby create the solder connection 104 (FIG. 1) including four segments coupling the four exposed portions 306 of the PCB thermal pad 106 to the exposed thermal pad 102 of the QFP 100. Each segment of the solder connection 104 couples a respective exposed portion 306 of the PCB thermal pad 106 to a corresponding portion of the exposed thermal pad 102 of the QFP 100.

As previously mentioned, during reflow of the deposited solder paste issues can arise that result in the solder connection 104 (FIG. 1) not adequately coupling the PCB thermal pad 106 and exposed thermal pad 102. For example, solder paste consists of a powdered metal solder suspended in a thick medium known as flux. The flux serves several functions, including holding the components being coupled together, namely holds the exposed thermal pad 102 of the QFP 100 to the PCB thermal pad 106 prior to reflow of the solder paste to create the solder connection 104. During reflow air or other gases generated in the solder paste can result in voids in the solder connection 104 and thus less than desired coupling between the exposed thermal pad 102 and PCB thermal pad 106.

Figure 5:
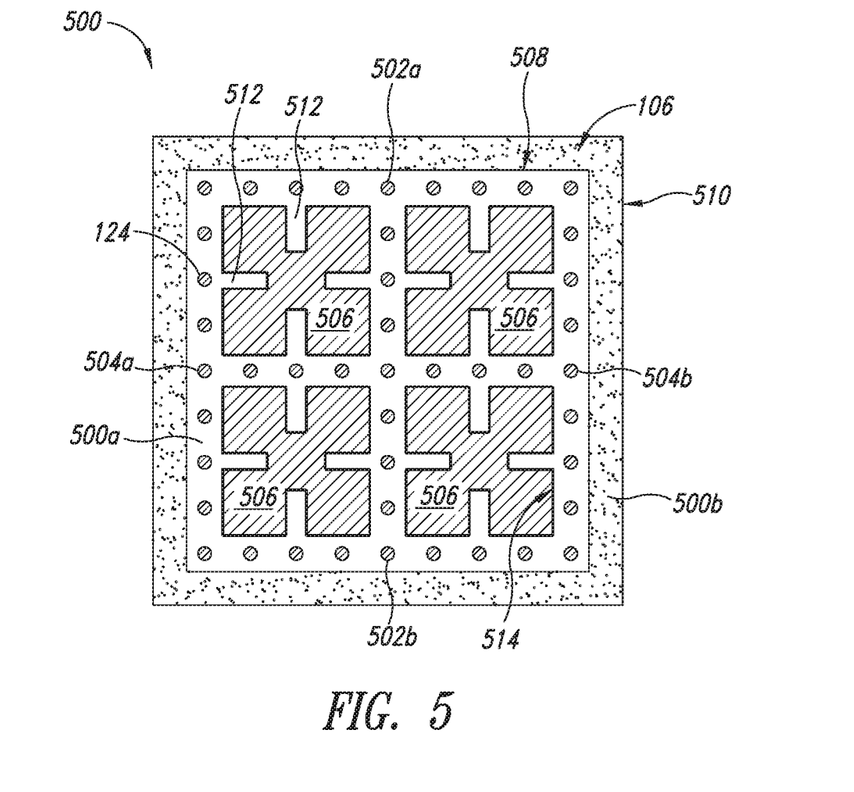
FIG. 5 is a top view of the thermal pad on the printed circuit board of FIGS. 1 and 3 showing the formation of a solder mask on this thermal pad and on the surface of the printed circuit board according to one embodiment of the present disclosure.

FIG. 5 is a top view of the PCB thermal pad 106 showing the formation of a solder mask 500 including an inner solder mask 500a formed on the upper surface of the PCB thermal pad 106, and an outer solder mask 500b formed on the surface of the PCB (not shown) on which the PCB thermal pad 106 is formed according to one embodiment of the present disclosure. The components 502-510 correspond to the components 302-310 and thus will not again be described in detail with reference to FIG. 5. The upper surface of the PCB thermal pad 106 is the surface of thermal pad opposite the surface on the surface 122 of the PCB 108. Unlike the solder mask 300a of FIGS. 3 and 4D, the solder mask 500a includes orthogonal mask extensions or stripes 512 extending from edges 514 of each unmasked portion 506 towards a center of the unmasked portion.

In the embodiment of FIG. 5, the solder mask 500a includes four orthogonal mask stripes 512, each orthogonal mask stripe extending orthogonally from a center of one of the edges 514 of the corresponding unmasked portion 506. Each orthogonal mask stripe 512 extends towards the center of the corresponding unmasked portion 506 but stops short of the center of the unmasked portion. In this way, the center of each unmasked portion 506 remains unmasked along with the other portions of the unmasked portion not covered by the mask stripes 512. These mask stripes 512 of the solder mask 500a may provide better air or gaseous venting on the outer portions of each unmasked portion 506 and redirect molten solder during reflow of the solder paste towards the center of each unmasked portion to form solder connection 104 (FIG. 1) with a higher standoff due to surface tension for better contact and solder coverage on each unmasked portion of the PCB thermal pad 106.

Figure 6:
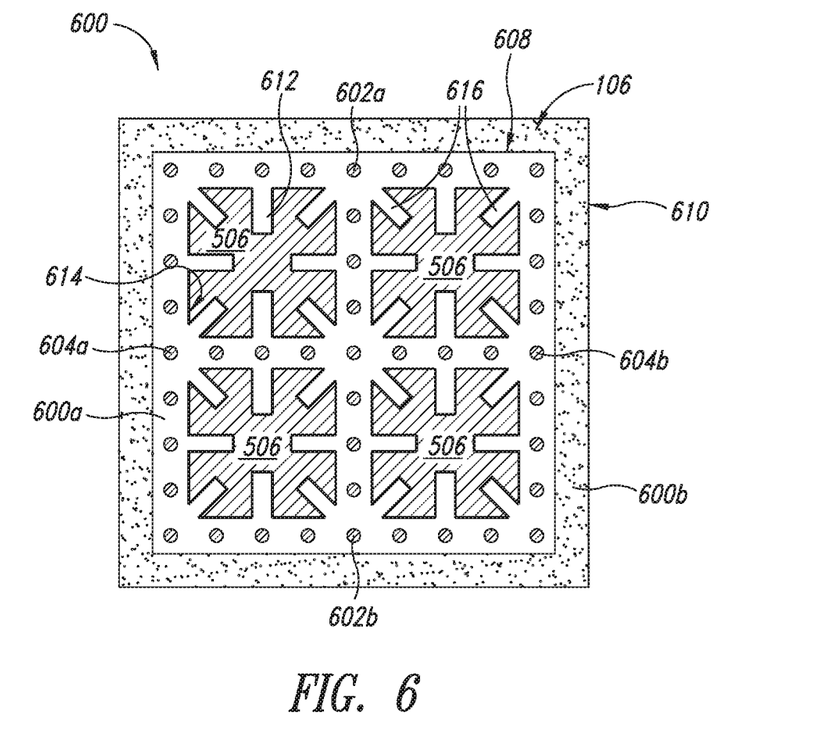
FIG. 6 is a top view of the thermal pad on the printed circuit board of FIGS. 1 and 3 showing the formation of a solder mask on this thermal pad and on the surface of the printed circuit board according to a further embodiment of the present disclosure.

FIG. 6 illustrates a solder mask 600 including an inner solder mask 600a formed on the upper surface of the PCB thermal pad 106 and an outer solder mask 600b formed on the surface of the PCB (not shown) on which the PCB thermal pad 106 is formed according to a further embodiment of the present disclosure. In the embodiment of FIG. 6, the solder mask 600a includes components 602-610 corresponding to the components 502-510 in the solder mask 500 of FIG. 5, and accordingly these components will not again be discussed in detail. The solder mask 600a includes orthogonal mask extensions or stripes 612 extending from edges 614 of each unmasked portion 506 towards a center of the unmasked portion in the same way as the orthogonal mask stripes 512 of FIG. 5. In addition, the solder mask 600 further includes angled corner mask stripes 616 extending from each corner of each unmasked portion 506 towards the center of the unmasked portion. In the embodiment of FIG. 6, each angled corner mask stripes 616 extends at a 45 degree angle from the edges 614 of the corresponding unmasked portion 506. The angled corner mask stripes 616 may extend at angles other than 45 degrees in other embodiments of the solder mask 600.

Figure 7:
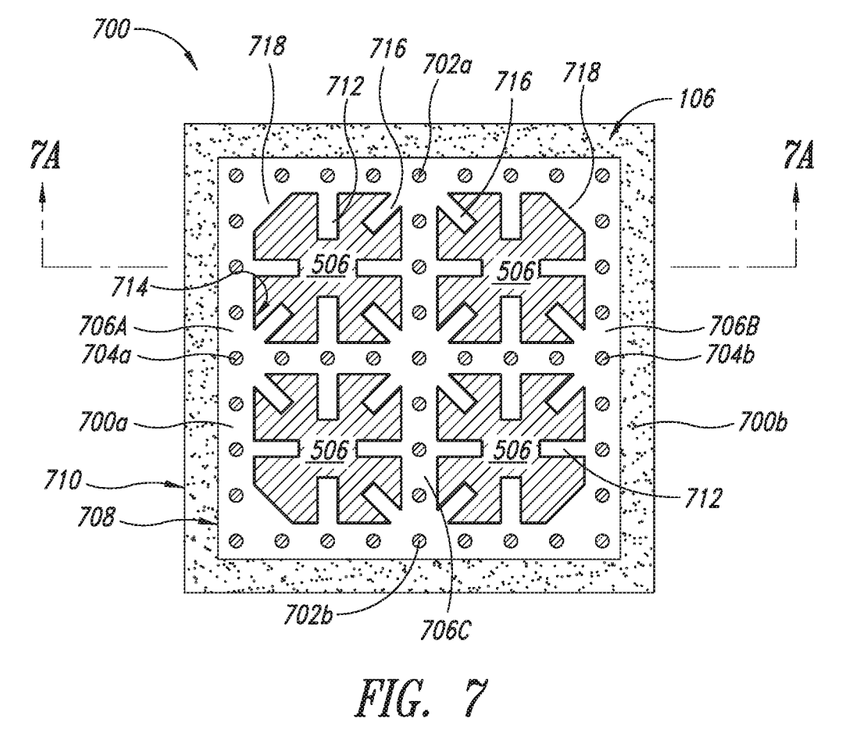
FIG. 7 is a top view of the thermal pad on the printed circuit board of FIGS. 1 and 3 showing the formation of a solder mask on this thermal pad and on the surface of the printed circuit board according to a further embodiment of the present disclosure.

FIG. 7 illustrates a solder mask 700 including an inner solder mask 700a formed on the upper surface of the PCB thermal pad 106 and an outer solder mask 700b formed on the surface 122 of the PCB 108 (see FIG. 7A) on which the PCB thermal pad 106 is formed according to a further embodiment of the present disclosure. In the embodiment of FIG. 7, the solder mask 700a includes components 702-710 corresponding to the components 502-510 in the solder mask 500 of FIG. 5, and accordingly these components will not again be discussed in detail. The solder mask 700a includes orthogonal mask extensions or stripes 712 extending from edges 714 of each unmasked portion 506 towards a center of the unmasked portion in the same way as the orthogonal mask stripes 512 of FIG. 5. In addition, the solder mask 700 further includes angled corner mask stripes 716 extending from each corner of each unmasked portion 506 towards the center of the unmasked portion in the same way as the angled corner mask stripes 616 of FIG. 6.

The solder mask 700a also further includes corner mask stripes 718 formed in one corner of the solder mask surrounding each unmasked portion 506. In the embodiment of FIG. 7, a corner mask stripe 718 is formed in one of the corners of each unmasked portions 506. The angled corner mask stripes 716 extend from the other three corners of the unmasked portion 506. Thus, as seen in FIG. 7 for the upper left unmasked portion 506, the corner mask stripe 718 is formed covering the upper left corner of this unmasked portion while the angled corner mask stripes 716 extend from the other three corners of this unmasked portion. The upper right unmasked portion 506 includes the corner mask stripe 718 formed covering the upper right corner of this unmasked portion while the angled corner mask stripes 716 extend from the other three corners of this unmasked portion. The same is true for the lower left and lower right unmasked portions 506, with a corner mask stripe 718 covering the lower left and lower right corners of these corresponding unmasked portions and having angled corner mask stripes 716 extending from the other three corners. In the solder mask 700a, the vertically extending far left portion 706A, far right portion 706B, and vertically extending center portion 706C of the solder mask 700a are labelled in FIG. 7 for use in discussing the cross-sectional view of this figure taken along the line 7A, as will now be described with reference to FIG. 7A.

Figure 7A:
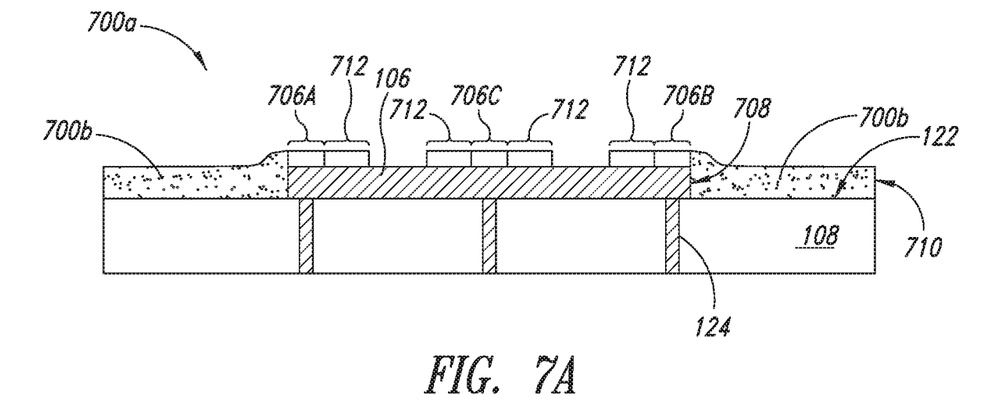
FIG. 7A is a cross-sectional view of the thermal pad and solder mask of FIG. 7.

FIG. 7A is a cross-sectional view of the PCB thermal pad 106 and solder mask 700a of FIG. 7 along the cross-section line labeled 7A in FIG. 7. As seen in FIG. 7A, the PCB thermal pad 106 includes the solder mask 700a formed on the upper surface of this thermal pad, where the upper surface is the surface opposite the surface of the thermal pad on the surface 122 of the PCB 108. The solder mask 700a is a thin layer of suitable material, such as suitable ink, that is printed or otherwise formed on the upper surface of the PCB thermal pad 106. The portions 706A and 706B of the mask 700a are shown on the far left and far right sides, respectively, on the surface of PCB thermal pad 106, with the orthogonal mask stripes 712 adjoining each of these portions 706A, 706B. Similarly, the center portion of the mask 700a in the center of the PCB thermal pad 106 is shown as including the vertically extending center portion 706C with orthogonal mask stripes 712 to the left and right of this vertically extending center portion.

Figure 8:
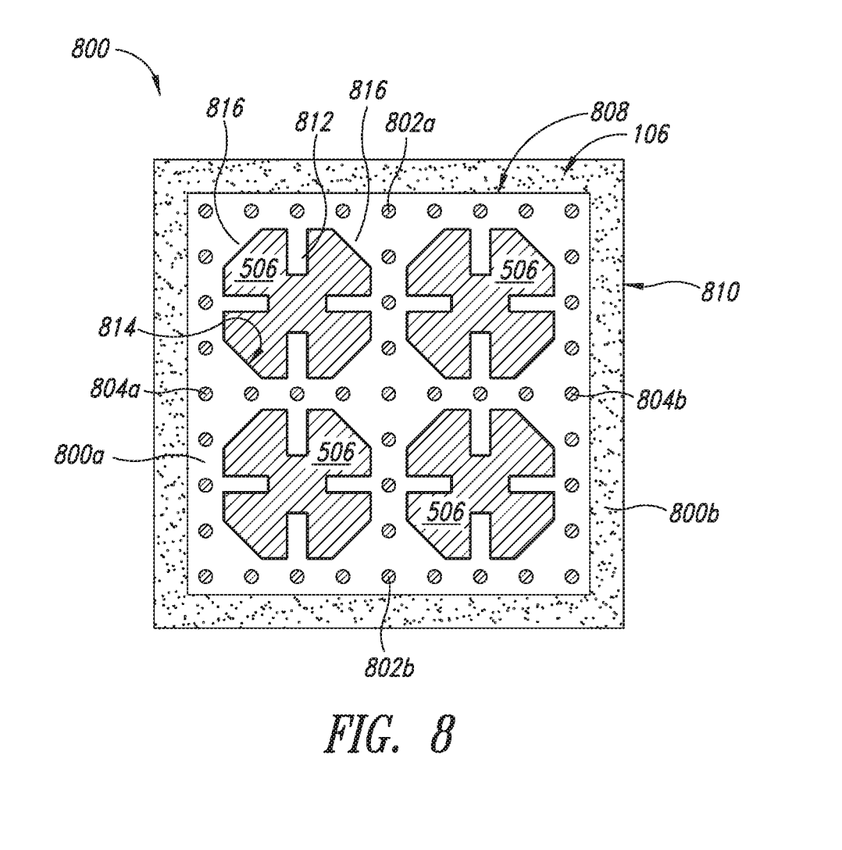
FIG. 8 is a top view of the thermal pad on the printed circuit board of FIGS. 1 and 3 showing the formation of a solder mask on this thermal pad and on the surface of the printed circuit board according to a still further embodiment of the present disclosure.

FIG. 8 illustrates a solder mask 800 including a solder mask 800a formed on the PCB thermal pad 106 and an outer solder mask 800b formed on the surface of the PCB (not shown) on which the PCB thermal pad is formed according to a further embodiment of the present disclosure. FIG. 8 illustrates the solder mask 800a including components 802-810 corresponding to the components 502-510 in the solder mask 500 of FIG. 5, and accordingly these components will not again be discussed in detail. The solder mask 800a includes orthogonal mask extensions or stripes 812 extending from edges 814 of each unmasked portion 506 towards a center of the unmasked portion in the same way as the orthogonal mask stripes 512 of FIG. 5. In addition, the solder mask 800a further includes corner mask stripes 816 formed in each of corners of the solder mask surrounding each unmasked portion 506. These corner mask stripes 816 are the same as the corner mask stripes 718 of FIG. 7 except that a corner mask stripe is formed to cover each corner of each unmasked portion 506 in the embodiment of FIG. 8. One skilled in the art will understand suitable methods of forming and suitable materials for forming the solder masks 500-800 of FIGS. 5-8 on the thermal pad 106 and the surface 122 of the printed circuit board 108.

Figure 9:
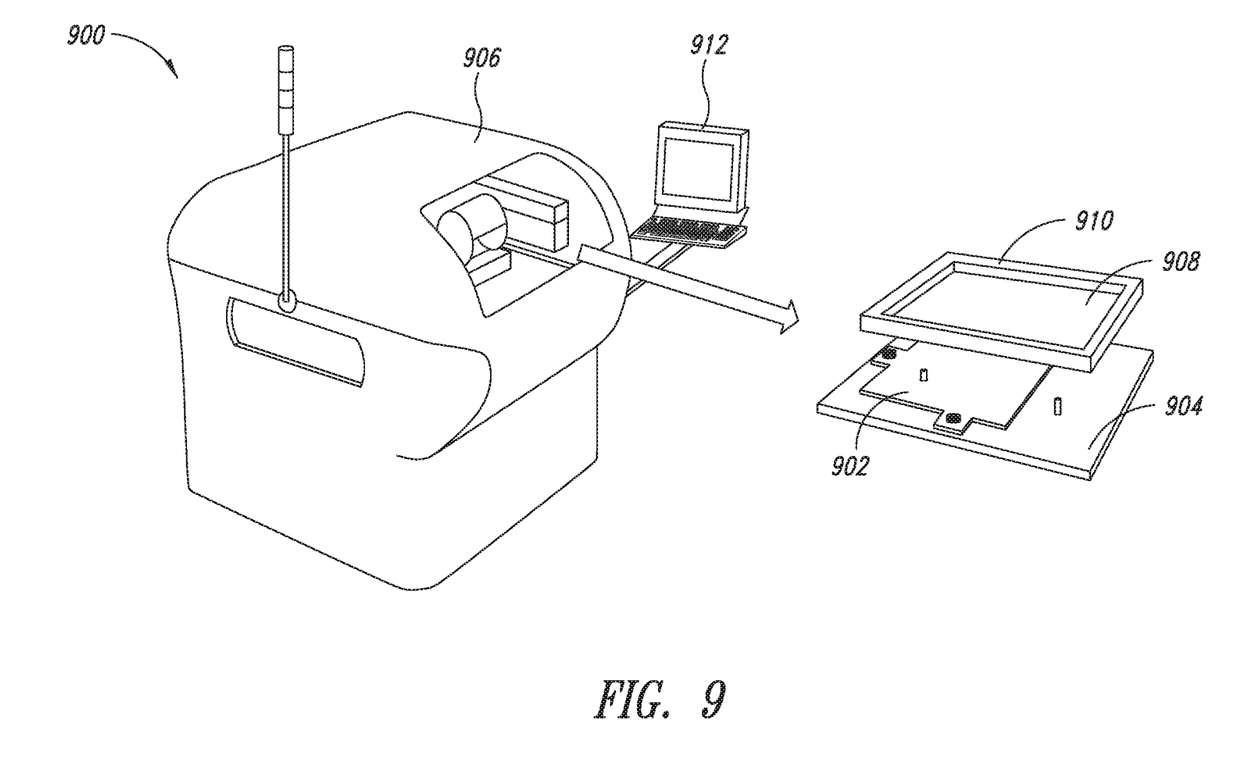
FIG. 9 is a perspective view illustrating a stencil printing system for depositing solder paste on thermal pad of the printed circuit board of FIGS. 1 and 3 after formation on the thermal pad of one of the solder masks of FIGS. 5-8 according to embodiments of the present disclosure.

FIG. 9 is a perspective view illustrating a stencil printing system 900 for depositing solder paste on one or more thermal pads (not shown in FIG. 9) of a printed circuit board 902, where the one or more thermal pads include one of the solder masks of FIGS. 5-8 according to embodiments of the present disclosure. As will be appreciated by those skilled in the art, stencil printing is the process of depositing solder paste on the thermal pads and other contacts on the printed circuit board 902. Stencil printing is followed by placement of components on the printed circuit board 902, as described above with reference to FIG. 1 and the placement of the QFP 100 on the PCB 108. The printed circuit board 902 includes one or more PCB thermal pads corresponding to the thermal pad 106 of FIG. 1.

In operation, one of the solder masks 500-800 is first formed on each of the thermal pads on the printed circuit board 902. After formation of the solder mask 500-800 on each thermal pad, the stencil printing system 900 deposits solder paste on the unmasked portions of each of the thermal pads, as discussed above with reference to FIGS. 4A-4D. The printed circuit board 902, which may be attached to a carrier board 904, is placed in a stencil printer 906 along with a stencil 908 carried by a stencil frame 910. No such carrier board 904 need be used in some situations, as will be appreciated by those skilled in the art. The stencil printer 906 is then controlled to deposit solder paste on the one or more thermal pads on the printed circuit board 902, as will now be described in more detail with reference to FIGS. 10 and 11. This control of the stencil printer 906 is represented in FIG. 9 through a computer system 912 shown coupled to the stencil printer.

Figure 10A:
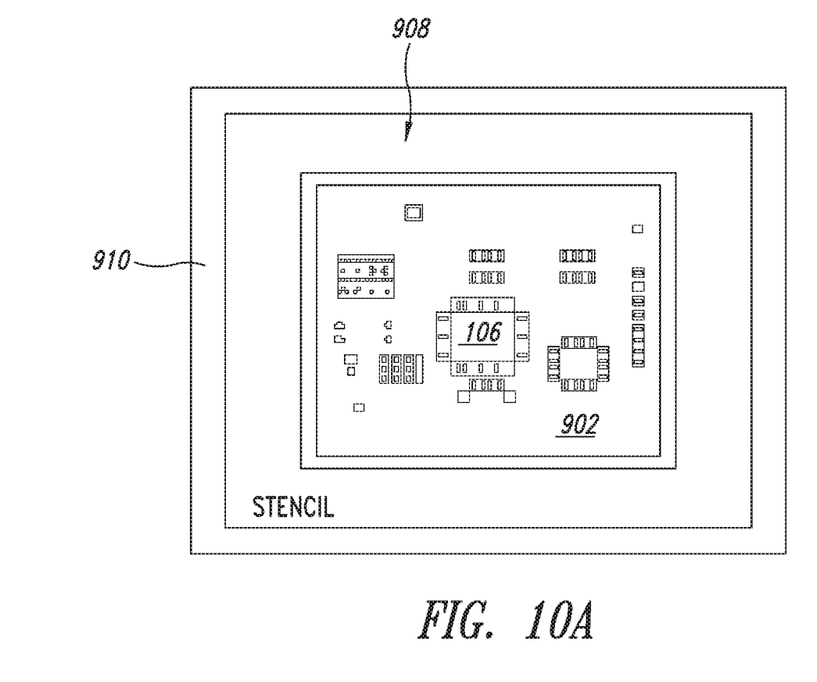
FIGS. 10A and 10B are a top view and a side view of the stencil of FIG. 9.
Figure 10B:
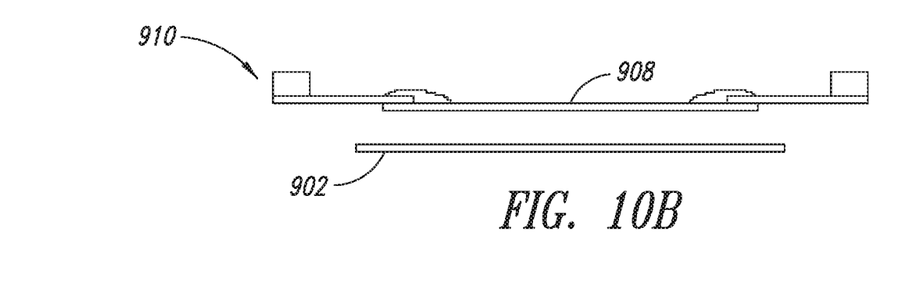
Figure 11:
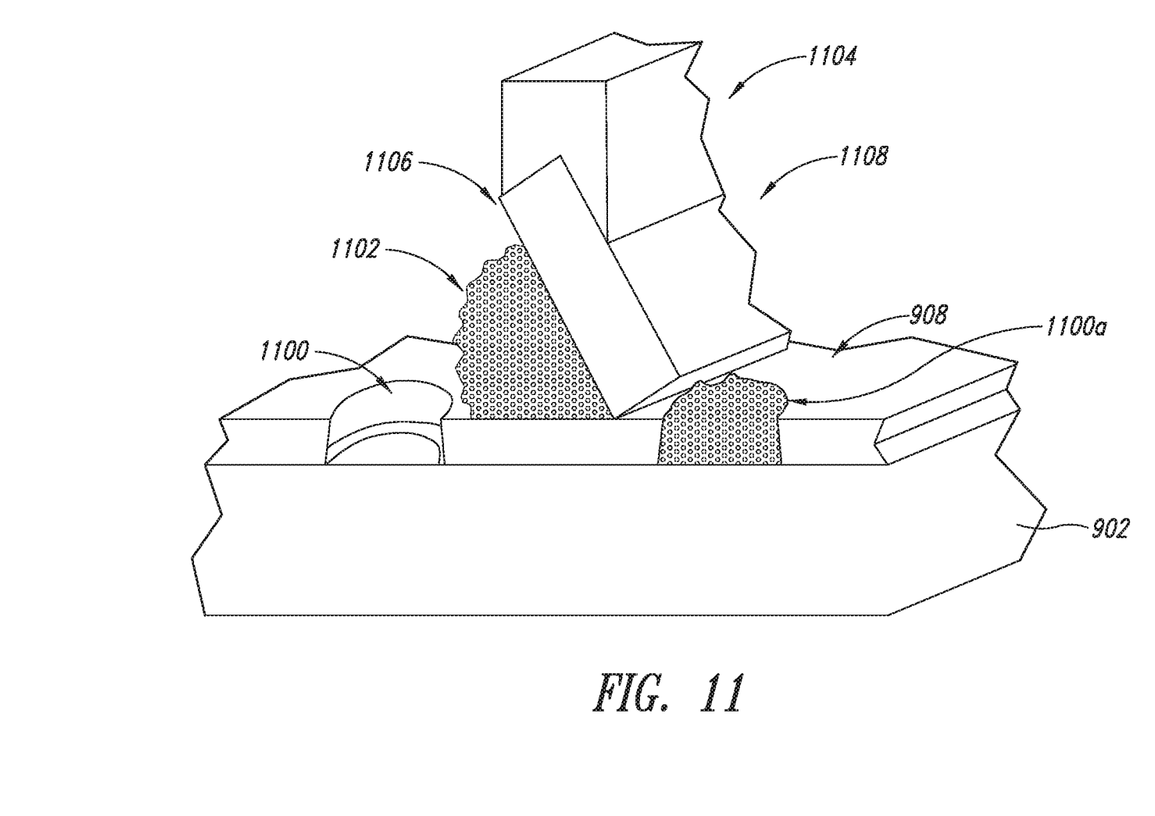
FIG. 11 is an exploded view of a portion of the stencil of FIGS. 9 and 10 showing deposition of solder paste on the thermal pad including the solder mask of any of FIGS. 5-8.

FIGS. 10A and 10B are a top view and a side view of the stencil 908 and stencil holder 910 of FIG. 9. As seen in FIG. 10B, the printed circuit board 902 supported by the carrier board 904 (not shown in FIG. 10B) is positioned under the stencil 908 carried by the stencil frame 910. The stencil printer 906 of FIG. 9 then forces solder paste through holes or apertures in the stencil 908 to deposit this solder paste on the thermal pads on the printed circuit board 902 and other desired contacts on the printed circuit board as well. This deposition of the solder paste is illustrated in FIG. 11, which is an exploded portion of the stencil 908 of FIGS. 9 and 10. As seen in FIG. 11, the stencil 908 includes holes or apertures 1100 through which solder paste 1102 is forced by a holder 1104 moving a squeegee blade 1106 over the surface of the stencil from right to left as indicated by the arrow 1108 in the example of FIG. 11. As the squeegee blade 1106 moves the solder paste 1102 over one of the apertures 1100 the solder paste is forced through the aperture and onto desired thermal pads and contacts on the printed circuit board 902. In FIG. 11, an aperture 1100A to the right of the squeegee blade 1106 is shown filled with solder paste 1102 after the squeegee has moved over that aperture from right to left. The solder paste 1102 under the squeegee blade 1106 will next be forced through the aperture 1100 in the stencil 908 as the squeegee blade moves from right to left across the stencil.

Figure 12:
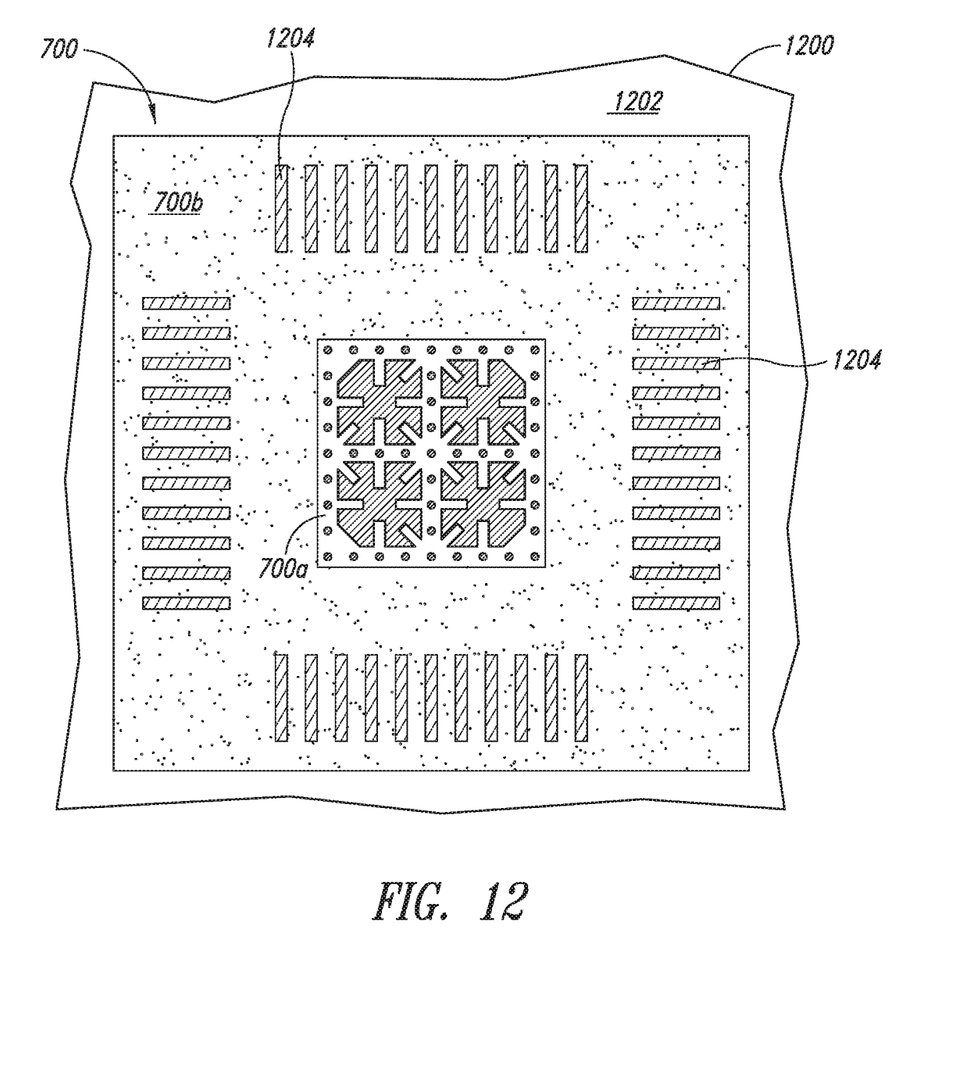
FIG. 12 is a top view of portion of a printed circuit board showing the formation of the solder mask of FIG. 7 on the thermal pad of the printed circuit board according to an embodiment of the present disclosure.

FIG. 12 is a top view of portion of a printed circuit board (PCB) 1200 showing on a PCB thermal pad on a surface 1202 of the PCB and on the surface of the PCB of the solder mask 700 of FIG. 7 according to an embodiment of the present disclosure. The solder mask 700 includes the inner solder mask 700a formed on the upper surface of the PCB thermal pad of the PCB 1200 and the outer solder mask 700b formed on the surface of the PCB surrounding the inner solder mask. The PCB 1200 includes a plurality of conductive pads or contacts 1204 formed around the inner solder mask 700a as shown. Each of these contacts 1204 is coupled to electrical traces (not shown) in the PCB 1200 and is configured to receive a conductive lead, such as a gull-wing lead 116 of the QFP 100 of FIG. 2. Solder paste would also be deposited on these contacts 1204 at the same time solder paste is deposited on the exposed portions 506 of the PCB thermal pad (see FIG. 7), as discussed for the solder mask 300 with reference to FIGS. 4A-4D. This solder paste would then be reflowed to attach the exposed thermal pad 102 of the QFP 100 (FIG. 4B) to the PCB thermal pad on the surface 1202 of the PCB 1200, and to electrically couple the gull-wind leads 116 of the QFP 100 (FIG. 2) to the contacts 1204 on the surface 1202 of the PCB 1200. In the embodiment of FIG. 12, the outer solder mask 700b extends on the surface 1202 of the PCB 1200 past outer or distal edges of the contacts 1204.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a solder mask on a first thermal pad of a printed circuit board and leaving an unmasked portion of the thermal pad exposed from the solder mask, forming the solder mask on the thermal pad including:
    forming a plurality of mask stripes extending from respective edges of the unmasked portion towards a center of the unmasked portion, each respective mask stripe of the plurality of mask stripes terminates at a respective end before extending fully across the unmasked portion of the thermal pad;
    depositing solder paste on the unmasked portion of the thermal pad;
    coupling a second thermal pad of an integrated circuit package to the solder paste on the first thermal pad of the printed circuit board; and
    forming a solder connection by:
    heating the solder paste between the first thermal pad and the second thermal pad.

2. The method of claim 1, wherein the unmasked portion comprises a square region surrounded by edges of the solder mask on the first thermal pad, and wherein forming the solder mask further comprises forming an orthogonal mask stripe extending from one of the edges of the unmasked portion towards a center of the unmasked portion.

3. The method of claim 2, wherein the square region of the unmasked portion includes four corners, and wherein forming the solder mask further comprises forming angled corner mask stripes extending from at least one corner of the unmasked portion towards the center of the unmasked portion.

4. The method of claim 2, wherein each of the square unmasked portions includes four corners and wherein forming the solder mask further comprises forming a corner mask stripe in each corner.

5. The method of claim 2, wherein forming the solder mask further comprises forming an angled corner mask stripe extending from each corner of each unmasked portion towards a center of the unmasked portion.

6. The method of claim 1, wherein the unmasked portion comprises a square region surrounded by edges of the solder mask on the first thermal pad, the square region includes four corners, and wherein forming a corner mask stripe in one of the corners of the square region of the unmasked portion.

7. The method of claim 1, wherein depositing solder paste on the unmasked portions of the thermal pad comprises stencil printing solder paste on the unmasked portions.

8. The method of claim 1, further comprising forming a boundary solder mask on a surface of the printed circuit board around the first thermal pad and the solder mask on the first thermal pad.

9. A method, comprising:
    forming a solder mask on a thermal pad of a printed circuit board, forming the solder mask including:
    leaving unmasked portions of the thermal pad exposed from the solder mask, wherein the unmasked portions each include a square region; and
    forming a plurality of mask stripes extending from respective edges of the solder mask around each of the unmasked portions towards respective centers of the unmasked portions, the forming a plurality of mask stripes including forming a first corner mask stripe in a first corner of a first of the square regions of the unmasked portions.

10. The method of claim 9, wherein each square region is surrounded by the respective edges of the solder mask on the thermal pad, and wherein the forming the plurality of mask stripes further comprises forming orthogonal mask stripes of the plurality of mask stripes extending from the respective edges of each of the unmasked portions towards the respective center of each of the unmasked portion.

11. The method of claim 10, wherein the forming the plurality of mask stripes further comprises forming an angled corner mask stripe in a second corner of each one of the square regions of the unmasked portions.

12. The method of claim 10, wherein forming the orthogonal mask stripes further comprises forming each of the orthogonal mask stripes to extend from a center point of a respective one of the edges of the solder mask.

13. The method of claim 12, wherein each of the square regions of the unmasked portions includes four corners, and wherein forming the plurality of stripes further comprises forming angled corner mask stripes extending from one of the corners of each of the unmasked portions towards each of the respective centers of each of the unmasked portions.

14. The method of claim 13, wherein forming the angled corner mask strips of the solder mask further comprises forming the angled corner mask stripes to extend from every corner of each unmasked portion towards a corresponding one of the respective centers of the unmasked portions.

15. The method of claim 9, wherein the forming the plurality of mask stripes further comprises forming a second corner mask stripe in each corner of each of square regions of the unmasked portions.

16. The method of claim 9, wherein each square region is surrounded by the respective edges of the solder mask on the thermal pad forming a second corner mask stripe in one corner of each of the unmasked portions.

17. A method, comprising:
    forming a solder mask on a thermal pad including:
    forming respective edges of the solder mask around an unmasked portion of the thermal pad and leaving the unmasked portion of the thermal pad exposed from the solder mask; and
    forming a mask stripe extending from at least one of the respective edges towards a center of the unmasked portion of the thermal pad, the mask stripe terminates at a respective end before extending fully across the unmasked portion of the thermal pad.

18. The method of claim 17, wherein:
    forming the respective edges of the solder mask around the unmasked portion includes forming a square region of the unmasked portion surrounded by the respective edges of the solder mask; and forming the mask stripe includes forming the mask stripe extending from a center point of at least one of the respective edges towards the center of the unmasked portion of the thermal pad.

19. The method of claim 17, wherein:

forming the respective edges of the solder mask around the unmasked portion includes forming a square region of the unmasked portion surrounded by the respective edges of the solder mask; and forming the mask stripe includes forming the mask stripe of the solder mask extending from a corner of the square region towards the center of the unmasked portion of the thermal pad.

20. The method of claim 17, wherein:

forming the respective edges of the solder mask around the unmasked portion includes forming a square region of the unmasked portion surrounded by the respective edges of the solder mask; and forming the mask stripe includes forming the mask stripe of the solder mask at a corner of the square region, to extend towards the center of the unmasked portion of the thermal pad, and to extend between a pair of adjacent ones of the respective edges of the solder mask.

* * * * *